United States Patent [19]
Bohning

[11] 3,979,600
[45] Sept. 7, 1976

[54] SENSE CIRCUIT ARRANGEMENT
[75] Inventor: Oliver D. Bohning, Placentia, Calif.
[73] Assignee: Rockwell International Corporation, El Segundo, Calif.
[22] Filed: Nov. 14, 1974
[21] Appl. No.: 523,598

[52] U.S. Cl. .............................. 307/125; 323/75 E; 323/75 N
[51] Int. Cl.² ........................................ G01R 17/10
[58] Field of Search ................. 323/75 E, 75 N, 40, 323/75 A; 307/116, 125, 117

[56] References Cited
UNITED STATES PATENTS

| | | | |
|---|---|---|---|
| 3,414,834 | 12/1968 | Stubbs | 223/75 E |
| 3,495,159 | 2/1970 | Smith | 323/75 E |
| 3,568,044 | 3/1971 | Elazar | 323/75 N |

Primary Examiner—Herman J. Hohauser
Attorney, Agent, or Firm—H. Fredrick Hamann; G. Donald Weber, Jr.; Morland Charles Fischer

[57] ABSTRACT

A unique, two-node sense circuit is disclosed. The circuit includes a bridge comprised of resistance elements and a differential amplifier. The two-node circuit is suitably adapted to be arranged in an array comprised of a plurality of discrete bridge-amplifiers which can be selectively energized. The circuit is arranged so as to form a configuration with minimum power utilization and a reduced number of components and interconnections therebetween.

12 Claims, 2 Drawing Figures

SENSE CIRCUIT ARRANGEMENT

The invention described herein was made in the performance of work under NASA Contract No. NAS-1-12435 and is subject to the provisions of Section 305 of the National Aeronautics and Space Act of 1958 (72 Stat. 435; 42 U.S.C. 2457).

BACKGROUND OF THE INVENTION

1. Field of the Invention

This invention relates generally to a bridge-amplifier sense circuit such as that which may be employed to sense the presence of a bubble in a magnetic bubble domain memory.

2. Description of the Prior Art

The presence of a magnetic bubble in a magnetic bubble domain memory may be sensed through the use of a resistance bridge, or the like. One example of a sensing system which includes a magnetic bubble domain detection device having magnetoresistance elements related thereto is application Ser. No. 290,607, filed Sept. 20, 1970, and assigned to the present assignee. The aforementioned sensing system may be utilized in the area of magnetic memory devices.

Generally, an individual high gain amplifier and a respective differential amplifier with a suitable control element are required to be connected to each resistance bridge or the like in order to process a suitable output sense signal. Thus, a relatively large number of interconnections and high gain amplifier stages are necessary in a conventional sense circuit when the sensing operation employs a plurality of bridges to monitor a corresponding plurality of bubble locations, such as in a large memory. This has resulted in relatively high costs and space consumption. Moreover, the presently available sensing circuits are arranged so as to use power relatively inefficiently.

SUMMARY OF THE INVENTION

Briefly, and in general terms, a two-node integrated sense circuit is disclosed, such as that which may be used in a magnetic bubble domain memory. The sense circuit, in the preferred embodiment, includes a bridge comprised of impedance elements and a differential amplifier having an associated current source means connected thereto. A first source of potential is provided to energize the bridge. The differential amplifier and its associated current source means are connected between the bridge and a second source of potential through a diode. The differential amplifier may be comprised of a pair of balanced transistors. The base electrode of each respective transistor is connected to opposite ends of the impedance bridge. The collector electrode of each transistor is connected to a circuit output terminal means. The presence of a magnetic bubble in the proximity of the bridge causes a change in the impedance thereof. A current unbalance is subsequently produced in the differential amplifier, such that a corresponding differential voltage signal will be produced at the output terminal means that is indicative of the presence of the bubble.

The instant two node sense circuit configuration is suitably adapted to be arranged into an array comprised of a plurality thereof. Selection means are provided for the energization of any discrete bridge comprising the array. Thus, any particular bridge location may be selectively sensed at a predetermined time. The instant sense circuit has the effect of reducing power consumption and minimizing the number of components and the corresponding cost for mechanizing the array.

DESCRIPTION OF THE PREFERRED EMBODIMENT

Figure 1:
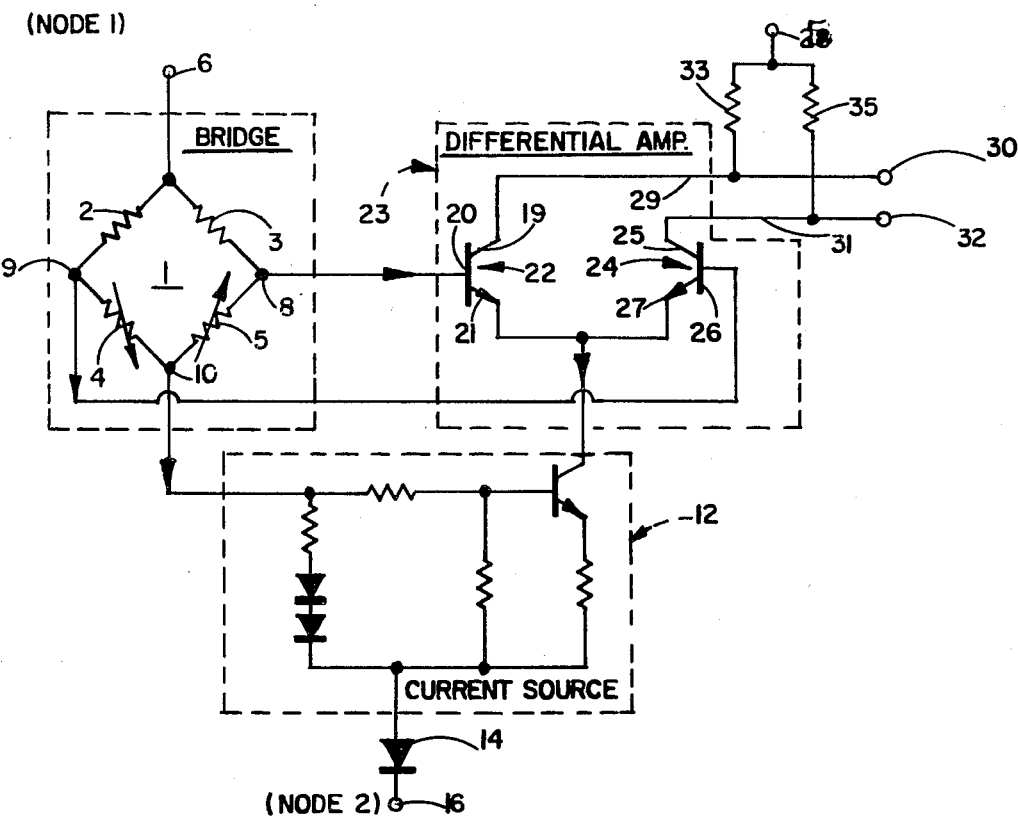
FIG. 1 shows the two node sense circuit of the instant invention.

FIG. 1 shows an integrated sense circuit configuration formed in accordance with the instant invention. In the preferred embodiment, the instant sense circuit configuration may be utilized to produce an amplified output signal indicative of the presence of a magnetic bubble (i.e. a stable region of reversed magnetization in a thin film of magnetized material, such as, for example, an orthoferrite, garnet or other suitable material) at a predetermined location in a magnetic domain bubble memory. Impedance elements such as resistors 2, 3, 4 and 5 are connected together to form a well-known bridge configuration 1. Resistance elements 2 and 3 are conventional isolation resistors. Resistance elements 4 and 5 are selected so that the resistance thereof will change proportionately in the presence of a magnetic field. In a preferred embodiment, resistance elements 4 and 5 are thin film magnetoresistors which may be formed from a permalloy material, such as that composed of nickel and iron. Resistors 4 and 5 may be either separately or together with resistance elements 2 and 3, disposed directly upon a bubble domain memory, integrated circuit chip. Bridge 1 includes a first node 6 which is adapted to be connected to a first suitable source of potential to energize the bridge. A resistance change in one of the resistors comprising the bridge 1 may be detected by passing a current therethrough and by detecting a corresponding change in voltage. For example, when a bubble, with its surrounding magnetic field, approaches one of the magnetoresistors 4 or 5, the resistance of the affected magnetoresistor will change. This change can be detected by sensing the relative change in bridge voltage (e.g. the voltage between bridge nodes 8 and 9).

The bridge 1 is connected to a differential amplifier 23. In a preferred embodiment, a conventional current source 12 is connected to the differential amplifier 23 and to the bridge 1 (e.g. at node 10). Current source 12 is mechanized as a suitable voltage dividing network to control the current being conducted through amplifier 23 and to provide sufficient current limiting for bridge 1. The current source 12 and the differential amplifier 23 may be fabricated together in an integrated circuit arrangement on a single semiconductor chip, such as model No. CA3005 manufactured by RCA. It is also to be understood, however, that current source 12 may be replaced by other suitable impedance networks, such as those which would provide the necessary current control for the instant sense circuit.

An output terminal of the differential amplifier current source 12 is connected to the anode of a conventional high voltage, reverse breakdown diode 14. The cathode of diode 14 is connected to a second node 16, as shown. Node 16 is adapted to be connected to a second source of potential.

The differential amplifier 23 is comprised of a balanced pair of semiconductor transistors 22 and 24, each transistor having respective base, collector, and emitter electrodes thereof. Transistors 22 and 24 are selected so that the voltages across their respective base and emitter electrodes will be substantially identical when there is the absence of a signal which would indicate the presence of a bubble. Although transistors 22 and 24 are described, amplifier 23 may be comprised of any other suitable balanced pair of three terminal semiconductor devices. The collector electrode 19 of transistor 22 is connected to an output terminal 30 by means of line 29. The collector electrode 25 of transistor 24 is connected to an output terminal 32 by means of line 31. A terminal 28 is connected to output terminals 30 and 32 through resistance elements 33 and 35, respectively. Terminal 28 is adapted to be connected to a source of potential which is relatively larger (i.e. more positive) than the source of potential to be connected to node 16.

During operating conditions, current from terminal 28 is normally evenly distributed through lines 29 and 31 of differential amplifier 23, inasmuch as transistors 22 and 24 are nominally balanced. Current is conducted from the amplifier 23 through current source 12 and diode 14 to node 16. The amount of current supplied to node 16 is established by current source 12 and by the resistance of elements 2, 3, 4 and 5. A voltage may be measured between output terminals 30 and 32 to provide an indication of the presence of a bubble at a predetermined position with respect to the location of a bridge resistance element 4 or 5. Alternatively, output terminals 30 and 32 may be connected to a succeeding sense circuit configuration so as to form an array comprised of a plurality of bridge sensing locations (to be described in greater detail hereinafter in FIG. 2).

The bridge 1 is energized by a source of potential connected thereto at node 6. During a period of standby, node 6 is made to be at a lower potential than node 16. This will cause diode 14 to be back biased, and no current will flow in the circuit between first and second nodes 6 and 16, thereby conserving power. Additionally, without the current source 12 being energized, no current will flow between terminal 28 and node 6. During operation, node 6 is raised to a higher potential than that which is impressed upon node 16. Thus, diode 14 will become forward biased. Current will flow through bridge 1 and into current source 12 at node 10. The current will continue through diode 14 toward node 16 (e.g. in the direction indicated by the arrows). Current at node 9 of bridge 1 will be conducted to the base electrode 26 of transistor 24. Current at node 8 of bridge 1 will be conducted to the base electrode 20 of transistor 22, as shown.

As a magnetic bubble domain (e.g. in a layer of bubble domain material adjacent bridge 1) approaches one of the magnetoresistors 4 or 5 of bridge 1, the resistance thereof will vary according to the proximity of the bubble thereto. This change in resistance causes a corresponding change in the voltage between bridge nodes 8 and 9. The voltage change will cause a current unbalance at the normally balanced pair of transistors which comprise differential amplifier 23. For example, if the position of a magnetic bubble were to approach magnetoresistor 4, the voltage of node 9 will rise relative to the voltage of node 8. The current from node 9 to the base electrode 26 of transistor 24 will be greater than the current from node 8 to the base electrode 20 of transistor 22. Consequently, an unbalance is created between the respective currents through lines 29 and 31 from terminal 28. More particularly, the current through resistance element 33 to the collector electrode 19 of transistor 22 decreases with respect to the current through resistance element 35 to the collector electrode 25 of transistor 24. Hence, the voltage drop across resistance element 35 increases with respect to the source of potential connected to terminal 28. Conversely, the voltage drop across resistance element 33 decreases with respect to the source of potential connected to terminal 28. By detecting the relative drops in voltage of resistance elements 33 and 35 between output terminals 30 and 32, a signal is provided which is indicative of the presence of a magnetic bubble domain in the proximity of bridge resistance element 4. Moreover, the operation of transistors 22 and 24 provide a differential output voltage signal between terminals 30 and 32 which is amplified relative to the corresponding differential voltage between bridge nodes 8 and 9. That is, the differential voltage signal between the collector electrodes 19 and 25 of transistors 22 and 24 is relatively larger (i.e. more positive) than the corresponding differential voltage signal between the base electrodes 20 and 26 thereof.

One advantage of the configuration described in FIG. 1, is that the two node sense circuit of the instant invention is adapted to be efficiently arranged in an array comprised of a plurality thereof. One such array is that shown in FIG. 2. Means can also be provided to select one bridge out of the plurality of bridges for the purpose of sensing the presence of a bubble at a predetermined time and at any particular bridge location. The instant sense circuit array may comprise part of the output sense circuit of a large bubble memory.

Figure 2:
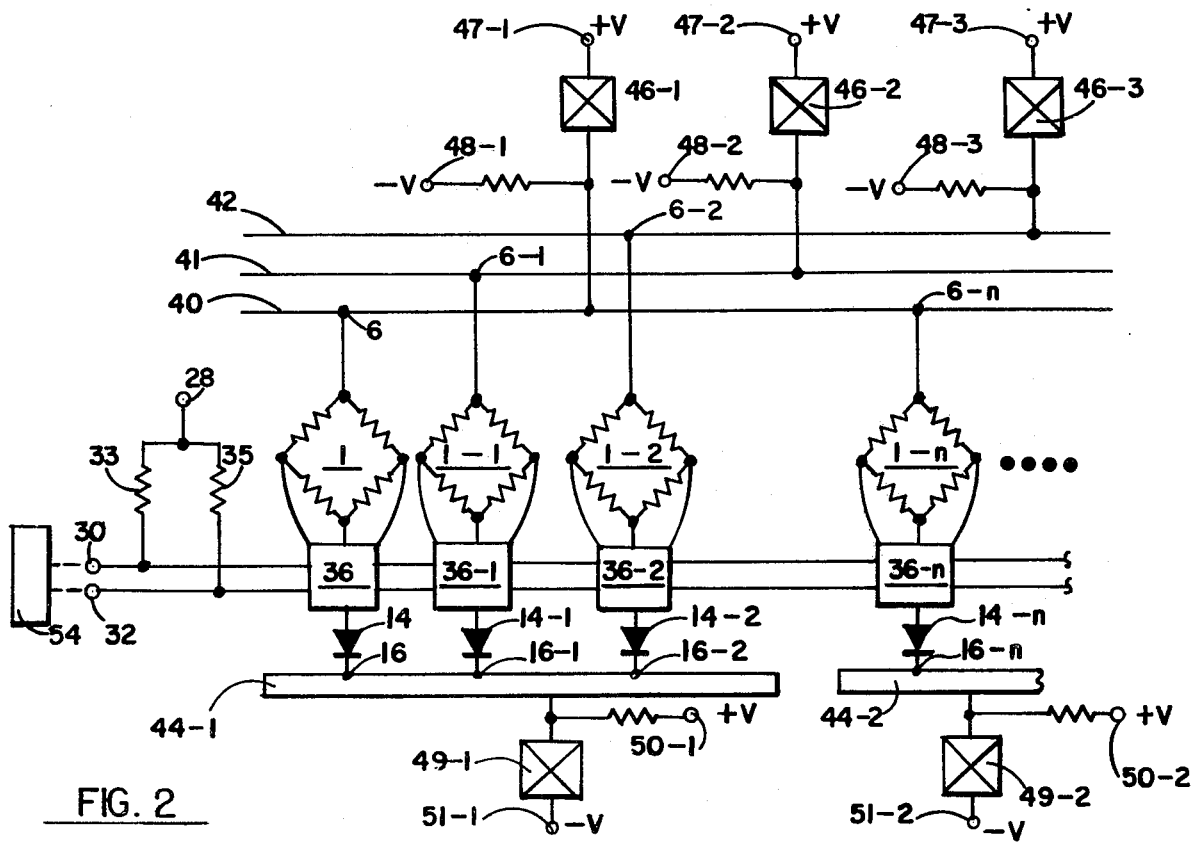
FIG. 2 shows an array comprised of a plurality of the sense circuits of the instant invention.

Nodes 6 through 6-$n$ of respective resistance bridges 1 through 1-$n$ of FIG. 2 are connected to power bus lines 40, 41 or 42 so as to be energized thereby. Each resistance bridge 1 through 1-$n$ of FIG. 2 are connected to power bus lines 40, 41 or 42 so as to be energized thereby. Each resistance bridge 1 through 1-$n$ is connected to a respective differential amplifier which may be integrally formed with a current source or the like and represented at 36 through 36-$n$. Output terminals 30 and 32 are connected in common with each of the differential amplifier arrangements 36 through 36-$n$. A respective unilaterally conductive means, for example diode 14 through 14-$n$, is connected between each differential amplifier arrangement 36 through 36-$n$ and nodes 16 through 16-$n$. Nodes 16 through 16-$n$ are connected in common to a respective discretely energized rail or power bus 44-1 or 44-2, as shown.

By virtue of the instant sense circuit array, suitable multiplexing or sampling means may be conveniently provided to selectively energize any one or more resistance bridges 1 through 1-$n$ which comprise the instant array. First suitable switch means 46-1, 46-2 and 46-3 are connected between the power bus lines 40, 41 and 42 and terminals 47-1, 47-2 and 47-3 respectively at one end thereof. The switch means may be selectively activated by any suitable control means (not shown). Terminals 47-1, 47-2 and 47-3 are adapted to be connected to a source of potential (e.g. 5 v. d.c.) which may be separate or common. Terminals 48-1, 48-2 and 48-3 are connected to the other end of respective first switch means 46-1, 46-2 and 46-3. Terminals 48-1, 48-2 and 48-3 are adapted to be connected to a source of potential (e.g. −5 v. d.c.) which may be separate or common. Second suitable switch means 49-1 and 49-2 are connected to discretely arranged common rails 44-1 and 44-2 respectively. The first and second switch means of the instant invention may be fabricated from any well known electrical or mechanical switching devices. Terminals 51-1 and 51-2 are connected to one end of a respective second switch means 49-1 and 49-2. Terminals 51-1 and 51-2 are adapted to be connected to a source of potential (e.g. −5 v. d.c.). Terminals 50-1 and 50-2 are connected to the other end of a respective second switch means 49-1 and 49-2. Terminals 50-1 and 50-2 are adapted to be connected to a source of potential (e.g. 5 v. d.c.) which may be separate or common.

Terminal 28 is connected to output terminals 30 and 32 through resistance elements 33 and 35, as shown. The output terminals 30 and 32 are connected to a signal processing stage represented at 54. For example, signal processing stage 54 may be a high gain amplifier, a level shifter, a signal converter or the like or any combination thereof.

In operation of the instant sense circuit array, one or more resistance bridges 1 through 1-n can be energized at a predetermined time. For example, to selectively energize resistance bridge 1, switch 46-1 is actuated to thereupon connect the potential at terminal 47-1 to power bus line 40. Switch means 46-2 and 46-3 are not actuated; and, therefore, the potential of terminal 48-2 and 48-3 are connected to a respective power bus line 41 and 42. Second switch means 49-1 is also actuated so as to connect the potential at terminal 51-1 to the common rail 44-1. This condition will forward bias diode 14 and complete a current path from node 6, through bridge 1 and differential amplifier 36 to node 16. As described with reference to FIG. 1, a signal (i.e. a differential voltage) is provided between output terminals 30 and 32 which is indicative of the presence or of the absence of a magnetic bubble in the proximity of resistance bridge 1. The output signal from terminals 30 and 32 may be processed accordingly by signal processing means 54. Any other resistance bridge 1-1 through 1-n may be energized at a predetermined time by actuating a respective first (46-n) and second (49-n) switch means, similar to that as described for resistance bridge 1.

A unique two-node sense circuit has been disclosed. The instant sense circuit includes a resistance bridge which may be connected directly to a current source and to a differential amplifier in a configuration which is suitably adapted to be arranged in an array, whereby a discrete resistance bridge therein can be selectively energized. The array is mechanized so as to form an arrangement with a more efficient use of power during the standby period of time. The instant sense circuit also requires a minimum number of components and interconnections therebetween.

It will be apparent that while a preferred embodiment of the invention has been shown and described, various modifications and changes may be made without departing from the true spirit and scope of the invention. For example, although a sense circuit resistance bridge has been described which is to be used in a preferred embodiment for sensing a magnetic bubble in a magnetic domain bubble memory, it is to be understood that the instant sense circuit may be utilized in other applications. The instant sense circuit could also be arranged in an array wherein each of the bridge arrangements is comprised of a plurality of suitable strain gages, or the like, for converting a mechanical force into a representative electrical output signal.

Having thus set forth a preferred embodiment of the instant invention, we therefore claim:

1. A sense circuit including
a bridge arrangement comprised of first impedance means,
the impedance of said bridge arrangement adapted to change in response to a condition to be sensed,
first source means connected to energize said bridge arrangement,
second source means,
third source means,
a differential amplifier connected between said bridge arrangement and said second source means to receive a signal from said bridge arrangement in response to a change in the impedance of said first impedance means,
second impedance means electrically connected between said third source means and said differential amplifier so as to provide a signal related to the signal received by said differential amplifier, and
output terminal means connected to said differential amplifier and said second impedance means to provide a signal in response to the operation of said differential amplifier to thereby indicate a change in the impedance of said bridge arrangement.

2. The sense circuit of claim 1, including diode means connected between said differential amplifier and said second source means.

3. The sense circuit of claim 2, wherein said differential amplifier includes current source means to control the current therethrough,
said current source means connected to said impedance bridge and to said diode means.

4. The sense circuit of claim 1, wherein said differential amplifier includes a balanced pair of three-terminal semiconductor devices.

5. The sense circuit of claim 1, wherein said third source means supplies a potential which is equal to or greater than the potential supplied by said second source means.

6. A sense circuit including
a plurality of bridge arrangements each of which includes at least one respective first impedance means,
the impedance of said first impedance means of at least one of said plurality of bridge arrangements adapted to change in response to a condition to be sensed,
first source means,
first means to selectively connect a respective bridge arrangement to said first source means for energization thereof,
second source means,
third source means,
at least one differential amplifier,
each of said at least one differential amplifier connected between a bridge arrangement and said second source means to receive a signal from said bridge arrangement in response to a change in the impedance of said at least one respective first impedance means,
second impedance means electrically connected between said third source means and said at least one differential amplifier so as to provide a signal related to the signal received by said at least one differential amplifier, and output terminal means electrically connected to said at least one differential amplifier and said second impedance means to provide a signal in response to the operation of said at least one differential amplifier to thereby indicate a change in the impedance of said bridge arrangement.

7. The sense circuit of claim 6, including a second means to selectively connect said at least one differential amplifier to said second source means.

8. The sense circuit of claim 7, wherein said first and second selection means are switches.

9. The sense circuit of claim 6, including a unilaterally conducting means connected between a respective differential amplifier and said second source means.

10. The sense circuit of claim 6, including a signal processing means connected to said output terminal means.

11. The sense circuit of claim 4, wherein each of said pair of three-terminal semiconductor devices has respective control terminal means and second and third conduction path terminal means, each of said control terminal means connected to said bridge arrangement, and each of said second and third conduction path terminal means connected to said second impedance means.

12. The sense circuit of claim 11, each of said pair of three-terminal semiconductor devices having respective first control terminal means and second and third conduction path terminal means, said second impedance means including first and second resistance means, each of said control terminal means connected to said bridge arrangement, said first resistance means connected to the conduction path terminal means of a first of said pair of devices, and said second resistance means connected to the conduction path terminal means of the second of said pair of devices.

* * * * *